United States Patent
Lee et al.

(10) Patent No.: US 9,688,571 B2
(45) Date of Patent: Jun. 27, 2017

(54) METHOD OF FABRICATING LIGHT EXTRACTION SUBSTRATE FOR ORGANIC LIGHT EMITTING DEVICE

(71) Applicant: Corning Precision Materials Co., Ltd., Chungcheongnam-do (KR)

(72) Inventors: Ki Yeon Lee, Chungcheongnam-do (KR); Kyung Min Yoon, Chungcheongnam-do (KR); Young Suk Lee, Chungcheongnam-do (KR); Jae Ho Lee, Chungcheongnam-do (KR)

(73) Assignee: Corning Precision Materials Co., Ltd. (KR)

( * ) Notice: Subject to any disclaimer, the term of this patent is extended or adjusted under 35 U.S.C. 154(b) by 0 days.

(21) Appl. No.: 14/906,122

(22) PCT Filed: Jul. 17, 2014

(86) PCT No.: PCT/KR2014/006484
§ 371 (c)(1),
(2) Date: Jan. 19, 2016

(87) PCT Pub. No.: WO2015/009073
PCT Pub. Date: Jan. 22, 2015

(65) Prior Publication Data
US 2016/0168022 A1      Jun. 16, 2016

(30) Foreign Application Priority Data

Jul. 17, 2013   (KR) .................. 10-2013-0084037

(51) Int. Cl.
*C03C 15/00*    (2006.01)
*C03C 23/00*    (2006.01)
(Continued)

(52) U.S. Cl.
CPC .......... *C03C 17/3417* (2013.01); *C03C 17/25* (2013.01); *G02B 5/0215* (2013.01);
(Continued)

(58) Field of Classification Search
CPC ............................. C03C 15/00; C03C 23/007
See application file for complete search history.

(56) References Cited

U.S. PATENT DOCUMENTS 4,310,370 A  *  1/1982  Arai .................... B32B 3/28
                                                 156/219
7,758,790 B2 *  7/2010  Itou .................... B28B 1/30
                                                 264/263
(Continued)

FOREIGN PATENT DOCUMENTS

JP     2012133944 A    7/2012
KR     20050064863 A   6/2005
KR     20110047098 A   5/2011

OTHER PUBLICATIONS

International Search Report and Written Opinion for Application No. PCT/KR2014/006484 dated Aug. 22, 2014.

*Primary Examiner* — Cynthia Szewczyk
(74) *Attorney, Agent, or Firm* — Lerner, David, Littenberg, Krumholz & Mentlik, LLP

(57) ABSTRACT

A method of fabricating a light extraction substrate for an organic light-emitting device which can increase the extraction efficiency of light emitted from the organic light-emitting device, thereby improving the overall luminous efficiency of the organic light-emitting device. Water glass is applied on a surface of a glass substrate. The water glass applied on the glass substrate is heat-treated such the surface of the glass substrate is roughened. The heat-treated water glass is removed from the glass substrate. A planarization (Continued)

layer of a glass frit is formed on the glass substrate from which the water glass has been removed.

10 Claims, 4 Drawing Sheets

(51) Int. Cl.
    *C03C 17/34*     (2006.01)
    *H01L 51/52*     (2006.01)
    *C03C 17/25*     (2006.01)
    *H01L 51/00*     (2006.01)
    *G02B 5/02*     (2006.01)

(52) U.S. Cl.
    CPC ........ *G02B 5/0278* (2013.01); *H01L 51/0096* (2013.01); *H01L 51/52* (2013.01); *H01L 51/5275* (2013.01); *C03C 2217/77* (2013.01); *C03C 2218/11* (2013.01); *C03C 2218/32* (2013.01); *H01L 51/5268* (2013.01); *Y02E 10/549* (2013.01)

(56) References Cited

U.S. PATENT DOCUMENTS

| | | | |
|---|---|---|---|
| 2004/0164662 A1 | 8/2004 | Cho et al. | |
| 2005/0003210 A1* | 1/2005 | Inoguchi | C03C 17/007 428/432 |
| 2008/0308143 A1* | 12/2008 | Atanackovic | C03C 17/36 136/255 |
| 2010/0102693 A1* | 4/2010 | Driver | A47B 95/043 312/408 |
| 2010/0173446 A1* | 7/2010 | Khadilkar | C03C 3/066 438/72 |
| 2012/0009396 A1* | 1/2012 | Sikka | C09D 7/1225 428/195.1 |
| 2012/0155093 A1 | 6/2012 | Yamada et al. | |
| 2012/0216880 A1* | 8/2012 | Nall | C03C 15/00 137/312 |

* cited by examiner (a)  (b)  (c)

METHOD OF FABRICATING LIGHT EXTRACTION SUBSTRATE FOR ORGANIC LIGHT EMITTING DEVICE

CROSS REFERENCE TO RELATED APPLICATIONS

The present application is a national phase entry under 35 U.S.C. §371 of International Application No. PCT/KR2014/006484, filed Jul. 17, 2014, which claims priority from Korean Application No. 10-2013-0084037, filed Jul. 17, 2013, all of which are incorporated herein by reference.

BACKGROUND OF THE INVENTION

Field of the Invention

The present invention relates to a method of fabricating a light extraction substrate for an organic light-emitting device, and more particularly, to a method of fabricating a light extraction substrate for an organic light-emitting device which can increase the extraction efficiency of light emitted from the organic light-emitting device, thereby improving the overall luminous efficiency of the organic light-emitting device.

Description of Related Art

In general, light-emitting devices can be generally divided into organic light-emitting devices in which a light-emitting layer is made of an organic matter and inorganic light-emitting devices in which a light-emitting layer is made of an inorganic matter. An organic-light-emitting device is a self-light emitting device which generates light using energy emitted from excitons that are generated through the recombination of electrons injected through a cathode and holes injected through an anode. Such organic light-emitting devices have a variety of advantages, such as, low-voltage driving, self-light emission, a wide viewing angle, a high resolution, natural color reproduction and rapid response.

Recently, active studies are underway in order to apply organic light-emitting devices to a variety of devices, such as portable information devices, cameras, watches, office equipment, information display windows of vehicles, televisions (TVs), displays, or illumination systems.

Approaches for improving the luminous efficiency of organic light-emitting devices include an approach of improving the luminous efficiency of a material that constitutes a light-emitting layer and an approach of improving the light extraction efficiency at which light generated from the light-emitting layer is extracted.

The light extraction efficiency depends on the refractive indices of the layers which form an organic light-emitting device. In a typical organic light-emitting device, when a ray of light generated from the light-emitting layer is emitted at an angle greater than a critical angle, the ray of light is totally reflected at the interface between a higher-refractivity layer which could be a transparent electrode layer and a lower-refractivity layer which could be a substrate. This consequently lowers the light extraction efficiency, thereby lowering the overall luminous efficiency of the organic light-emitting device, which is problematic.

More specifically, only about 20% of light generated from an organic light-emitting device is emitted to the outside and about 80% of the light is lost by a waveguide effect originating from the difference in the refractive index between a glass substrate and an organic light-emitting diode portion which includes an anode, a hole injection layer, a hole transport layer, an emissive layer, an electron transport layer and an electron injection layer, as well as by the total internal reflection originating from the difference in the refractive index between the glass substrate and the air. Here, the refractive index of the internal organic light-emitting layer ranges from 1.7 to 1.8, whereas the refractive index of indium tin oxide (ITO) which is generally used for the anode is about 1.9. Since the two layers have a very small thickness ranging from 200 to 400 nm and the refractive index of the glass used for the glass substrate is about 1.5, a planar waveguide is thereby caused inside the organic light-emitting device. It is calculated that the ratio of the light lost in the internal waveguide mode due to the above-described reason is about 45%. In addition, since the refractive index of the glass substrate is about 1.5 and the refractive index of the ambient air is 1.0, when the light is directed outward from the inside of the glass substrate, a ray of the light having an angle of incidence greater than a critical angle is totally reflected and is trapped inside the glass substrate. The ratio of the trapped light is about 35%, so only about 20% of the generated light is emitted to the outside.

In order to overcome this problem, in the related art, the surface of the glass substrate is roughened by hydrofluoric acid etching or sandblasting, and then a high refractive index frit is applied on the surface of the glass substrate. This can consequently disturb the internal waveguide mode, thereby improving the light extraction efficiency of the organic light-emitting device. The surface roughness of the glass substrate is required to be great since paths along which light is emitted can be diversified in proportion to the surface roughness. Then, a significant improvement in the light extraction efficiency can be expected.

However, this approach has a limit to increasing the surface roughness of the glass substrate. That is, it was proved that the conventional method does not have a significant effect in improving the light extraction efficiency of the organic light-emitting device.

The information disclosed in the Background of the Invention section is provided only for better understanding of the background of the invention and should not be taken as an acknowledgment or any form of suggestion that this information forms a prior art that would already be known to a person skilled in the art.

BRIEF SUMMARY OF THE INVENTION

Various aspects of the present invention provide a method of fabricating a light extraction substrate for an organic light-emitting device which can increase the extraction efficiency of light emitted from the organic light-emitting device, thereby improving the overall luminous efficiency of the organic light-emitting device.

In an aspect of the present invention, provided is a method of fabricating a light extraction substrate for an organic light-emitting device. The method includes the following steps of: applying water glass on a surface of a glass substrate; heat-treating the water glass applied on the glass substrate such that the surface of the glass substrate is roughened; removing the heat-treated water glass from the glass substrate; and forming a planarization layer of a glass frit on the glass substrate from which the water glass has been removed.

According to an exemplary embodiment, the water glass may be heat-treated at a temperature ranging from 150 to 500° C.

The water glass may be heat-treated at 170° C.

Distances between peaks in a roughness profile of the roughened surface may be controlled to be 50 μm or less.

The geometry of each peak viewed from above may be at least one selected from the group consisting of a circle, a polygon and an irregular shape.

The peaks are arranged to form a honeycomb pattern.

The surface roughness of the glass substrate after removing the heat-treated water glass may be controlled in the range from 1 to 35 μm.

The water glass may be applied on the glass substrate by bar coating.

The glass frit may have a refractive index ranging from 1.85 to 1.95.

The step of forming the planarization layer may include: applying a paste of the glass frit on the glass substrate; and firing the frit paste applied on the glass substrate.

According to embodiments of the present invention, it is possible to roughening one surface of the glass substrate which adjoins an organic light-emitting diode portion by applying water glass on the one surface of the glass substrate, heat-treating the water glass, and then removing the water glass from the glass substrate. This increases the roughness of the one surface of the glass substrate to diversify paths along which light from the organic light-emitting device is emitted, thereby improving the light extraction efficiency. This can consequently improve the overall luminous efficiency of the organic light-emitting device.

In addition, a planarization layer of a frit glass may be formed on the one surface of a glass substrate, the refractive index of the planarization layer being equal to that of the anode of an organic light-emitting device. The planarization layer can prevent the roughness of the one surface of the glass substrate from being transferred to the anode of the organic light-emitting device which would otherwise deteriorate the electrical characteristics of the organic light-emitting device, thereby contributing to an improvement in the light extraction efficiency.

The methods and apparatuses of the present invention have other features and advantages which will be apparent from, or are set forth in greater detail in the accompanying drawings, which are incorporated herein, and in the following Detailed Description of the Invention, which together serve to explain certain principles of the present invention.

DETAILED DESCRIPTION OF THE INVENTION

Figure 1:
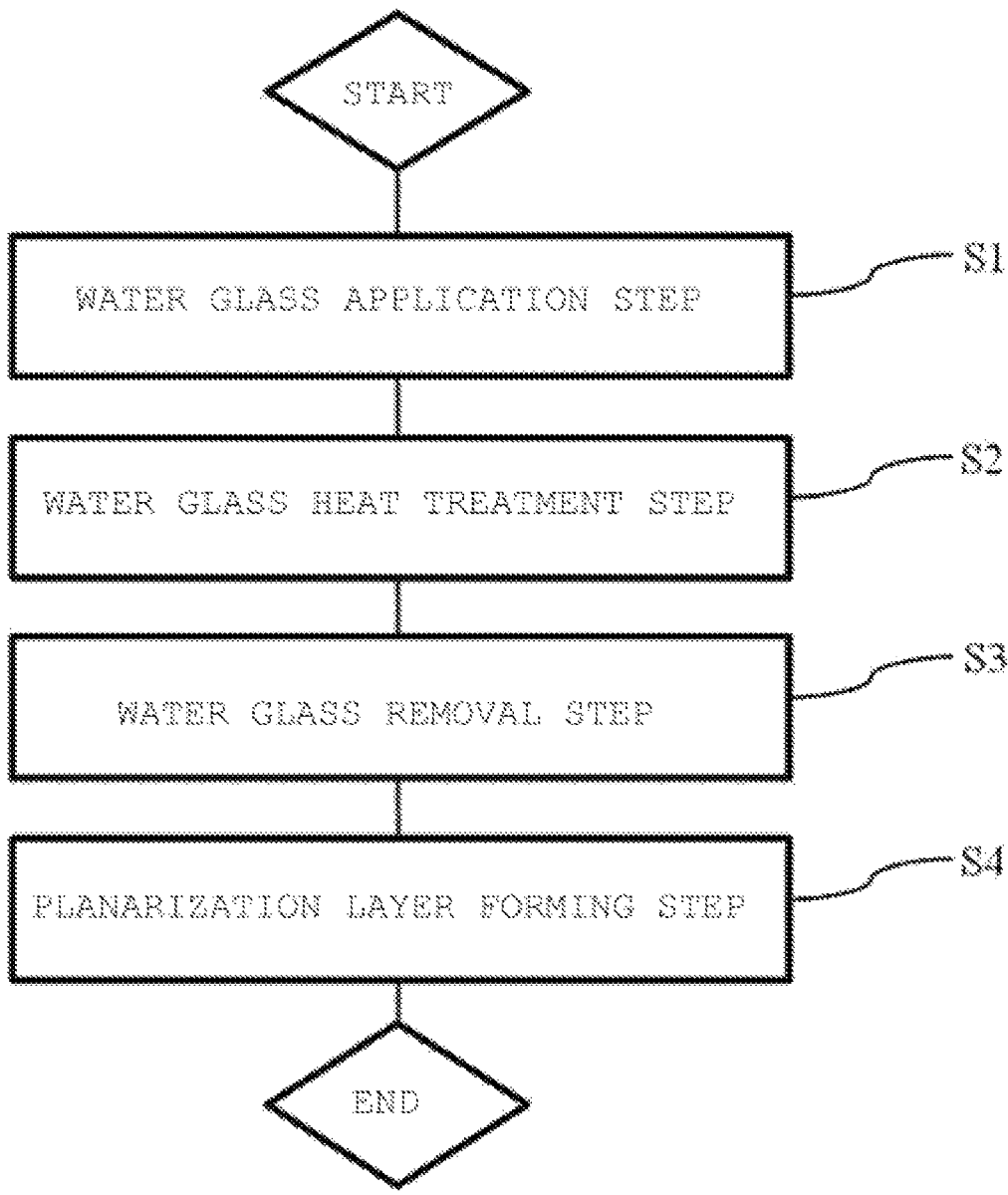
FIG. 1 is a flowchart showing a method of fabricating a light extraction substrate for an organic light-emitting device according to an exemplary embodiment of the present invention.

Reference will now be made in detail to a method of fabricating a light extraction substrate for an organic light-emitting device according to the present invention, embodiments of which are illustrated in the accompanying drawings and described below, so that a person skilled in the art to which the present invention relates can easily put the present invention into practice.

Throughout this document, reference should be made to the drawings, in which the same reference numerals and signs are used throughout the different drawings to designate the same or similar components. In the following description of the present invention, detailed descriptions of known functions and components incorporated herein will be omitted when they may make the subject matter of the present invention unclear.

As shown in FIG. 1, the method of fabricating a light extraction substrate for an organic light-emitting device according to an exemplary embodiment of the present invention is intended to fabricate a light extraction substrate (100 in FIG. 5) which is disposed on one surface of an organic light-emitting diode portion (10 in FIG. 6) through which light from the organic light-emitting diode portion (10 in FIG. 6) is emitted in order to improve the light extraction efficiency of the organic light-emitting device. The method of fabricating a light extraction substrate for an organic light-emitting device includes a water glass application step S1, a water glass heat treatment step S2, a water glass removal step S3 and a planarization layer forming step S4.

Figure 2:
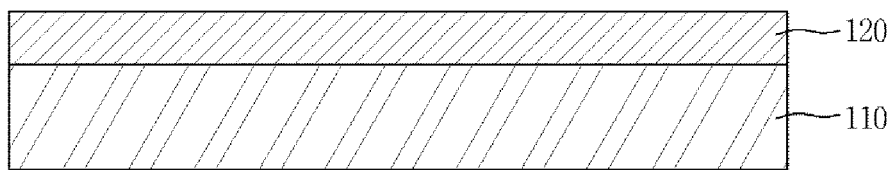
FIG. 2 to FIG. 6 are schematic cross-sectional views sequentially showing the process of the method of fabricating a light extraction substrate for an organic light-emitting device according to the exemplary embodiment of the present invention.

First, as shown in FIG. 2, the water glass application step S1 is carried out by applying water glass 120 on a surface of a glass substrate 110. At the water glass application step S1, the glass substrate 110 serves as an encapsulation substrate which is disposed at the front side of the organic light-emitting diode portion (10 in FIG. 6), i.e. on one surface of the organic light-emitting diode portion (10 in FIG. 6) through which light from the organic light-emitting diode portion (10 in FIG. 6) is emitted, in order to allow the light to exit while protecting the organic light-emitting diode portion (10 in FIG. 6) from the external environment. The glass substrate 110 can be made of a chemically strengthened glass such as a soda-lime glass ($SiO_2$—$CaO$—$Na_2O$) or an aluminosilicate glass ($SiO_2$—$Al_2O_3$—$Na_2O$)). When the organic light-emitting diode portion (10 in FIG. 6), on which the light extraction substrate (100 in FIG. 5) that will be fabricated according to this exemplary embodiment is to be disposed, is applied for lighting, the glass substrate 110 can be made of the soda-lime glass. When the organic light-emitting diode portion (10 in FIG. 6) is used in a display, the glass substrate 110 can be made of the aluminosilicate glass. The glass substrate 110 can be made of a piece of thin glass having a thickness of 1.5 mm or less. The thin glass can be made by a fusion process or a floating process.

At the water glass application step S1, it is possible to mix the water glass ($Na_2O.SiO_2.H_2O$) 120 with $H_2O$ in order to facilitate the application of the water glass 120 before the water glass 120 is applied on the glass substrate 110 by, for example, bar coating.

Figure 3:
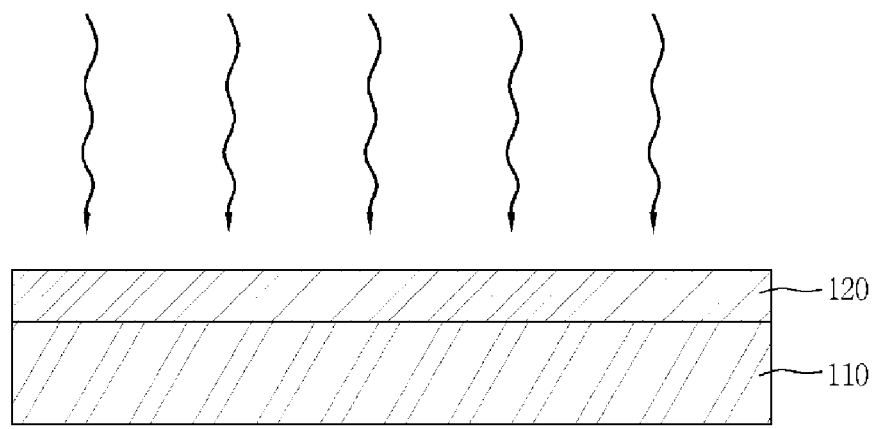

Afterwards, as shown in FIG. 3, the water glass heat treatment step S2 is carried out by heat-treating the water glass 120 applied on the glass substrate 110. The water glass 120 applied on the glass substrate 110 is heat-treated in order to roughening the surface of the glass substrate 110 by the reaction between the glass substrate 110 and the water glass 120, i.e. the thermal characteristics of the water glass 120. The roughened surface (111 in FIG. 4) of the glass substrate 110 contributes to improve the extraction efficiency of light emitted from the organic light-emitting diode portion (10 in FIG. 6) by diversifying paths along which the light is emitted, thereby improving the overall luminous efficiency of the organic light-emitting device.

For this purpose, at the water glass heat treatment step S2, the water glass 120 can be heat-treated at a temperature ranging from 150 to 500° C. When the water glass 120 is heat-treated at a temperature below 150° C., it is difficult to roughening the surface in such a level as to expect an improvement in the light extraction efficiency since moisture inside the water glass 120 does not sufficiently vaporize and the water glass 120 does not sufficiently react with the surface of the glass substrate 110. In contrast, when the water glass 120 is heat-treated at a temperature above 500° C., the water glass 120 becomes affixed to the surface of the glass substrate 110. Consequently, the subsequent process for exposing the roughened surface (111 in FIG. 4) by removing the water glass 120 from the glass substrate 110 becomes difficult.

Figure 7:
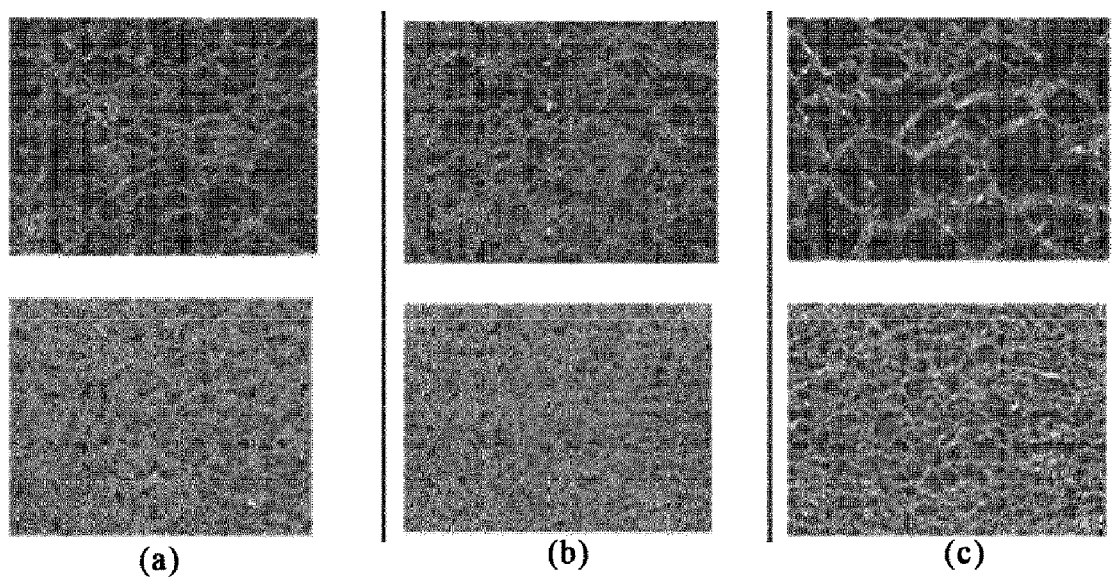
FIG. 7 shows pictures taken from the surfaces of glass substrates heat-treated at different temperatures.
Figure 8:
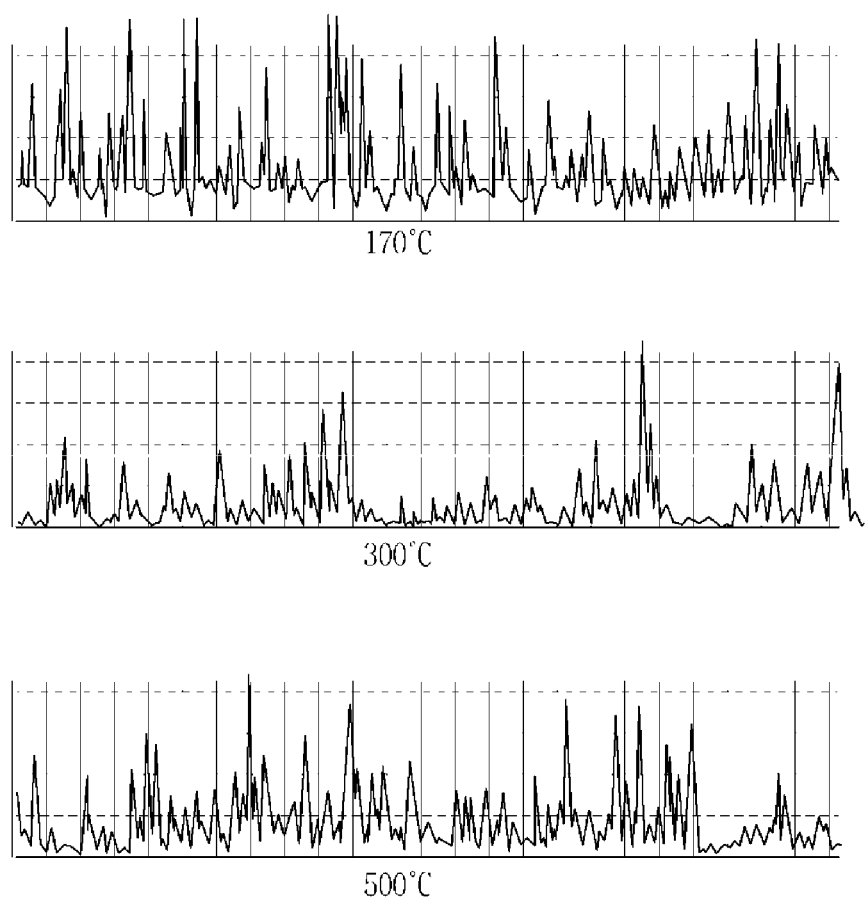
FIG. 8 is a view showing the surface roughness of the glass substrates heat-treated at different temperatures.

Thus, at the water glass heat treatment step S2, it is possible to control the level of the surface roughness of the glass substrate 110, through temperature control in the range from 150 to 500° C. As shown in the pictures taken from the surfaces of the glass substrates 110 of FIG. 7 and the view showing the surface roughness of the glass substrates 110 of FIG. 8, the surface roughness of the glass substrate 110 varies depending on the heat treatment temperatures. In FIG. 7, part (a) indicates a case where the water glass 120 was heat-treated at 500° C. for 10 minutes, part (b) indicates a case where the water glass 120 was heat-treated at 300° C. for 10 minutes, and part (c) indicates a case where the water glass 120 was heat-treated at 170° C. for 10 minutes. In case (c) where the water glass 120 was heat-treated at 170° C. for 10 minutes, the maximum surface roughness of the glass substrate 110 was measured 35 µm. It was proved that the surface roughness of the glass substrate 110 in case (c) was the greatest among the three cases. In case (c), the visible light transmittance was measured 91.7%, which was higher than the visible light transmittance of case (a) which was 90.2% and the visible light transmittance of case (b) which was 91.0%. Thus, it was proved that the visible light transmittance and surface roughness were the greatest when the water glass 120 was heat-treated at 170° C. for 10 minutes.

In addition, as presented in Table 1 below, it is appreciable that an increase in luminance with an increase in the viewing angle was also the greatest in case (c).

TABLE 1

| Viewing angle | a | b | c |
| --- | --- | --- | --- |
| 0 | 1894 | 998.1 | 1348 |
| 10 | 1916 | 1044 | 1415 |
| 20 | 2034 | 1159 | 1590 |
| 30 | 2322 | 1399 | 1962 |
| 40 | 2913 | 1813 | 2720 |
| 50 | 3868 | 2517 | 4107 |
| 60 | 5162 | 3662 | 6281 |
| 70 | 6686 | 5278 | 8657 |

Figure 4:
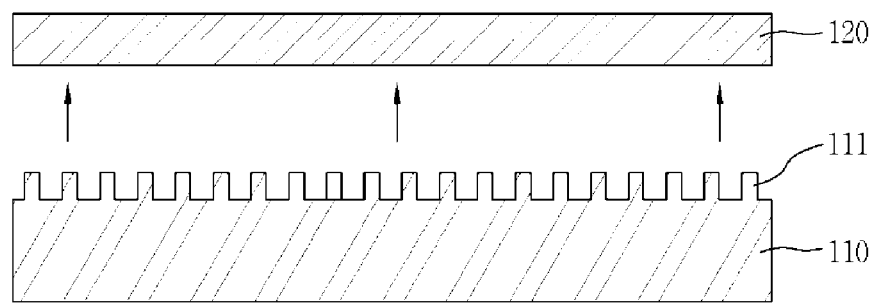

Subsequently, as shown in FIG. 4, the water glass removal step S3 is carried out by removing the heat-treated water glass 120 from the glass substrate 110. The water glass removal step S3 may include cleaning the surface of the glass substrate 110 from which the water glass 120 is removed. The removal of the water glass 120 from the glass substrate 110 in this manner exposes the roughened surface of the glass substrate 110 roughened at the water glass heat treatment step S2. By texturing the surface of the glass substrate 110 through the heat treatment of the water glass 120 at a temperature ranging from 150 to 500° C. at the water glass heat treatment step S2, the surface roughness of the glass substrate 110 can be controlled in the range from 1 to 35 µm. In addition, peak-to-peak distances in the roughness profile of the surface of the glass substrate 110 can be controlled to be 50 µm or less. As the roughened surface are formed on the glass substrate 110 in this manner, light from the organic light-emitting diode portion (10 in FIG. 6) can be emitted along diversified paths while passing through the roughened surface 111, thereby improving extraction efficiency. This can consequently improve the overall luminous efficiency of the organic light-emitting device. The geometry of each peak can be at least one selected from among a circle, a polygon and an irregular shape when viewed from above. The peaks are arranged to form an overall honeycomb pattern.

Figure 5:
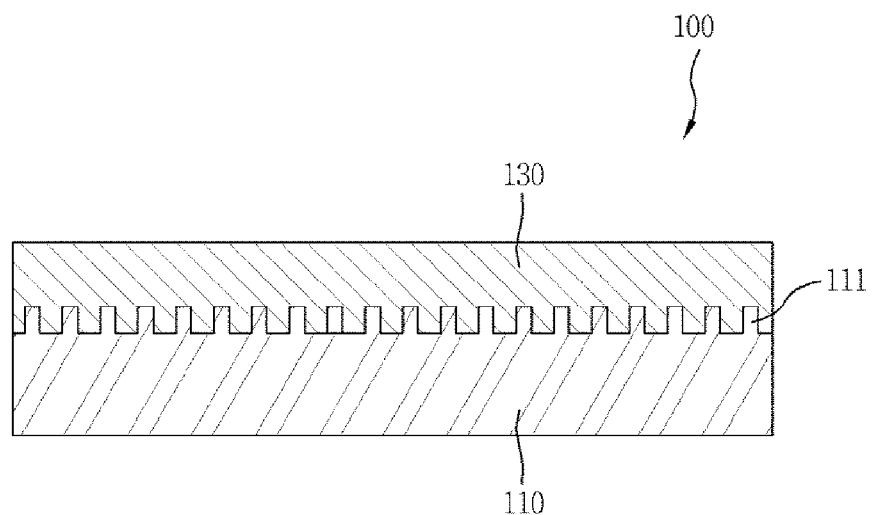

Afterwards, as shown in FIG. 5, the planarization layer forming step S4 is carried out by forming a planarization layer 130 of a glass frit on the roughened surface of the glass substrate 110 from which the water glass 120 has been removed. The planarization layer 130 is intended to adjoin the organic light-emitting diode portion (10 in FIG. 6) in order to prevent the roughness on the surface of the glass substrate 110 from being transferred to the organic light-emitting diode portion (10 in FIG. 6), thereby preventing the electrical properties of the organic light-emitting diode portion (10 in FIG. 6) from deteriorating.

At the planarization layer forming step S4, it is preferred that the planarization layer 130 be made of a material, the refractive index of which is equal or similar to that of the anode of the organic light-emitting diode portion (10 in FIG. 6), in order to prevent light emitted from the organic light-emitting diode portion (10 in FIG. 6) from being totally reflected from the interface between the organic light-emitting diode portion (10 in FIG. 6) and the planarization layer 130. At the planarization layer forming step S4 according to this exemplary embodiment, the planarization layer 130 can be made of a glass frit that has a refractive index ranging from 1.85 to 1.95. In case the planarization layer 130 is made of the glass frit in this manner, the planarization layer forming step S4 may include a frit paste application process and a frit paste firing process. First, at the frit paste application process, a frit paste is applied on the glass substrate 110. More particularly, the frit paste can be prepared by mixing frit powder into an organic solvent to which an organic binder is added before being applied on the glass substrate 110 by a suitable process such as screen printing. The organic solvent can be at least one selected from among, but not limited to, butyl carbitol acetate (BCA), α-terpineol (α-TPN), dibutyl phthalate (DBP), ethyl acetate, β-terpineol, cyclohexanone, cyclopentanone, hexylene glycol, high boiling point alcohol and mixtures of alcohol ester. In addition, the organic binder can be at least one selected from among, but not limited to, ethyl cellulose, ethylene glycol, propylene glycol, ethyl hydroxyethyl cellulose, phenolic resin, mixtures of ethyl cellulose and phenolic resin, ester polymer, methacrylate polymer, methacrylate polymer of lower alcohol and monobutyl ether of ethylene glycol monoacetate. At the frit paste application process, it is preferred that the planarization layer 130 be formed thick such that the roughness of the surface of the glass substrate 110 does not emerge on the surface of the planarization layer 130 that adjoins the organic light-emitting diode portion (10 in FIG. 6). Afterwards, at the frit paste firing process, the frit paste applied on the glass substrate 110 is fired.

Figure 6:
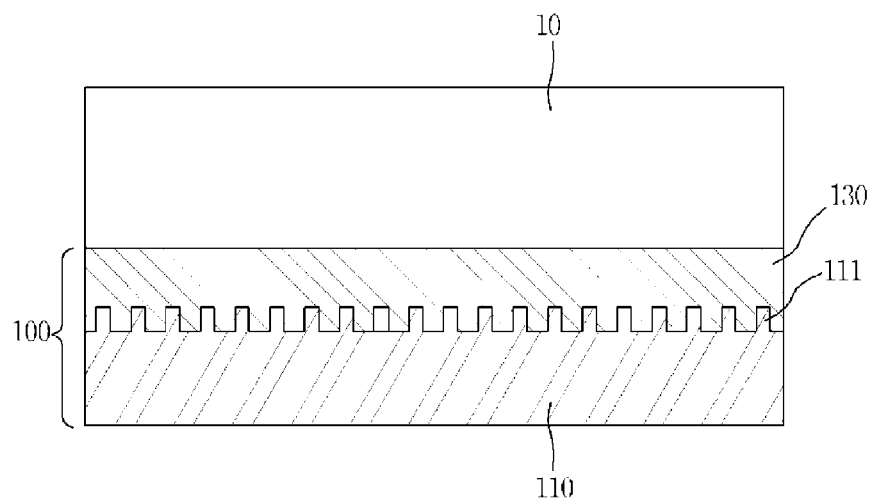

When the planarization layer 130 made of the glass frit is formed on the glass substrate 110 by firing the glass paste, the light extraction substrate 100 is fabricated. As shown in FIG. 6, the light extraction substrate 100 can be disposed on one surface of the organic light-emitting diode portion 10 through which light from the organic light-emitting diode portion 10 is emitted.

Although not shown in detail, the organic light-emitting diode portion 10 has a multilayer structure in which an anode, an organic light-emitting layer and a cathode are sandwiched between the light extraction substrate 100 and another substrate that faces the light extraction substrate 100. That is, the planarization layer 130 formed according to this exemplary embodiment adjoins the anode of the organic light-emitting diode portion 10. The anode can be made of a metal or metal oxide, for example, Au, In, Sn or indium tin oxide (ITO), which has a significant work function in order to facilitate the hole injection. The cathode can be made of a metal thin film of, for example, Al, Al:Li or Mg:Ag, which has a smaller work function in order to facilitate the electron injection. In case the organic light-emitting device 10 is a top emission type, the cathode can have a multilayer structure that includes a semitransparent electrode of a metal thin film made of Al, Al:Li or Mg:Ag and a transparent electrode of an oxide thin film made of, for example, ITO, in order to improve the transmission of light that is generated from the organic light-emitting layer. The organic light-emitting layer includes a hole injection layer, a hole transport layer, an emissive layer, an electron transport layer and an electron injection layer which are sequentially stacked on the anode. With this structure, when a forward voltage is induced between the anode and the cathode, electrons from the cathode migrate to the emissive layer through the electron injection layer and the electron transport layer, and holes from the anode migrate to the emissive layer through the hole injection layer and the hole transport layer. The electrons and holes that have migrated into the emissive layer recombine with each other, thereby generating excitons. When these excitons transit from an excited state to a ground state, light is emitted. The brightness of the light emitted is proportional to the amount of current that flows between the anode and the cathode.

As set forth above, the method of fabricating a light extraction substrate for an organic light-emitting device according to an embodiment of the present invention can roughen one surface of the glass substrate 110 which adjoins the organic light-emitting diode portion 10 by applying the water glass 120 on the one surface of the glass substrate 110, the water glass 120 being capable of reacting with the glass substrate 110, heat-treating the water glass 120, and then removing the water glass 120 from the glass substrate 110. The resultant roughened surface 111 of the glass substrate 110 can diversify paths along which light from the organic light-emitting diode portion is emitted, thereby improving the light extraction efficiency. This can consequently improve the overall luminous efficiency of the organic light-emitting device. This indicates that the organic light-emitting device can operate at a low current. Therefore, according to the present invention, it is possible to reduce the power consumption of the organic light-emitting device and improve the luminance of a display or a lighting system that employs the organic light-emitting diode portion 10.

In addition, the method of fabricating a light extraction substrate for an organic light-emitting device according to an embodiment of the present invention can form the planarization layer 130 made of the frit glass, the refractive index of which is equal to that of the anode of the organic light-emitting diode portion 10, in order to compensate the roughened surface 111 of the glass substrate 110. This can prevent the roughness on the one surface of the glass substrate 110 from being transferred to the anode of the organic light-emitting diode portion 10 which would otherwise deteriorate the electrical characteristics of the organic light-emitting diode portion, thereby improving the light extraction efficiency.

The foregoing descriptions of specific exemplary embodiments of the present invention have been presented with respect to the drawings. They are not intended to be exhaustive or to limit the present invention to the precise forms disclosed, and obviously many modifications and variations are possible for a person having ordinary skill in the art in light of the above teachings.

It is intended therefore that the scope of the present invention not be limited to the foregoing embodiments, but be defined by the Claims appended hereto and their equivalents.

What is claimed is:

1. A method of fabricating a light extraction substrate for an organic light-emitting device, the method comprising:
    applying water glass on a surface of a glass substrate;
    heat-treating the water glass applied on the surface of the glass substrate such that the surface of the glass substrate is roughened;
    removing the heat-treated water glass from the glass substrate; and
    forming a planarization layer of a glass frit on the roughened surface of the glass substrate.

2. The method according to claim 1, wherein the water glass is heat-treated at a temperature ranging from 150 to 500° C.

3. The method according to claim 2, wherein the water glass is heat-treated at 170° C.

4. The method according to claim 2, wherein distances between peaks in a roughness profile of the roughened surface are controlled to be 50 μm or less.

5. The method according to claim 4, wherein a geometry of each peak viewed from above comprises at least one selected from the group consisting of a circle, a polygon and an irregular shape.

6. The method according to claim 4, wherein the peaks are arranged to form a honeycomb pattern.

7. The method according to claim 2, wherein, a surface roughness of the roughened surface of the glass substrate after removing the heat-treated water glass is controlled in a range from 1 to 35 μm.

8. The method according to claim 1, wherein the water glass is applied on the surface of the glass substrate by bar coating.

9. The method according to claim 1, wherein the glass frit has a refractive index ranging from 1.85 to 1.95.

10. The method according to claim 9, wherein forming the planarization layer comprises:
    applying a paste of the glass frit on the roughened surface of the glass substrate; and
    firing the paste of the glass frit applied on the roughened surface of the glass substrate.

* * * * *